United States Patent
Kawano (10) Patent No.: US 10,599,801 B2
(45) Date of Patent: Mar. 24, 2020

(54) SEMICONDUCTOR CIRCUIT DESIGN DEVICE

(71) Applicant: RENESAS ELECTRONICS CORPORATION, Tokyo (JP)

(72) Inventor: Takashi Kawano, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 171 days.

(21) Appl. No.: 15/839,483

(22) Filed: Dec. 12, 2017

(65) Prior Publication Data
US 2018/0173819 A1     Jun. 21, 2018

(30) Foreign Application Priority Data

Dec. 16, 2016  (JP) .................. 2016-244092

(51) Int. Cl.
*G06F 17/50*  (2006.01)

(52) U.S. Cl.
CPC ........ *G06F 17/505* (2013.01); *G06F 17/5022* (2013.01)

(58) Field of Classification Search
USPC ........................................ 716/104
See application file for complete search history.

(56) References Cited

U.S. PATENT DOCUMENTS

| | | | | |
|---|---|---|---|---|
| 2006/0259207 A1* | 11/2006 | Natsume | ............... | G06F 8/65 701/1 |
| 2007/0028035 A1* | 2/2007 | Nishihara | ........... | G06F 12/0246 711/103 |
| 2018/0173819 A1* | 6/2018 | Kawano | .............. | G06F 17/5022 |

FOREIGN PATENT DOCUMENTS

JP       2004-164035 A       6/2004

OTHER PUBLICATIONS

Microchip Technology Inc., serial EEPROM Verilog model, 11xx010 Verilog Model.zip, M11AA010.v, Internet <URL: http://www.microchip.com/ja/design-centers/memory/serial-eeprom/verilog-ibis-models>, the retrieval date: Nov. 25, 2016.

* cited by examiner

*Primary Examiner* — Mohammed Alam
(74) *Attorney, Agent, or Firm* — McDermott Will & Emery LLP (57) ABSTRACT

A logic model of a nonvolatile memory device is commonly used in high order synthesis and a logic simulation. Further, the logic model of the nonvolatile memory device divides a one-time rewriting request area of the nonvolatile memory device into a plurality of areas, and rewrites each of the divided areas in a time division manner.

6 Claims, 7 Drawing Sheets

SEMICONDUCTOR CIRCUIT DESIGN DEVICE

CLAIM OF PRIORITY

The present application claims priority from Japanese patent application JP2016-244092 filed on Dec. 16, 2016, the content of which is hereby incorporated by reference into this application.

BACKGROUND

The disclosure relates to a semiconductor circuit design device, and can be applied to a circuit design device of a nonvolatile memory device incorporated in a semiconductor device.

Japanese Unexamined Patent Application Publication No. 2004-164035 discloses an integrated circuit design device and an integrated circuit design method that can design an integrated circuit at a high speed without performing high order synthesis.

"Microchip Technology Inc., serial EEPROM Verilog model, 11xx010 Verilog Model.zip, M11AA010.v, Internet <URL:http://www.microchip.com/ja/design-centers/memory/serial-eeprom/ve rilog-ibis-models>, the retrieval date: Nov. 25, 2016" discloses a serial EEPROM Verilog model. In the model, the states of a plurality of memory cells are simultaneously set using the FOR LOOP sentence as described in lines 1106 to 1125 of M11AA010.v in "Microchip Technology Inc., serial EEPROM Verilog model, 11xx010 Verilog Model.zip, M11AA010.v, Internet <URL: http://www.microchip.com/ja/design-centers/memory/serial-eeprom/ve rilog-ibis-models>, the retrieval date: Nov. 25, 2016".

SUMMARY

In Japanese Unexamined Patent Application Publication No. 2004-164035, there is a possibility that high-speed function verification and design assets at a high abstraction degree that are the merits of high order synthesis cannot be utilized because the high order synthesis is not performed.

In "Microchip Technology Inc., serial EEPROM Verilog model, 11xx010 Verilog Model.zip, M11AA010.v, Internet <URL:http://www.microchip.com/ja/design-centers/memory/serial-eeprom/ve rilog-ibis-models>, the retrieval date: Nov. 25, 2016", there is a risk that the time required for logic synthesis is increased because the states of the memory cells are simultaneously set using the FOR LOOP sentence.

An object of the disclosure is to provide a semiconductor circuit design device that can execute high order synthesis and a logic simulation in a short time as compared to the related art.

The other objects and novel features will become apparent from the description of the specification and the accompanying drawings.

The following is a summary of the representative outline of the disclosure.

Namely, a logic model of a nonvolatile memory device is commonly used in high order synthesis and a logic simulation. Further, the logic model of the nonvolatile memory device divides a one-time rewriting request area of the nonvolatile memory device into a plurality of areas, and rewrites each of the divided areas in a time division manner.

According to the above-described semiconductor circuit design device, high order synthesis and a logic simulation of a nonvolatile memory device can be performed in a short time as compared to the related art.

DETAILED DESCRIPTION

Hereinafter, an embodiment, a comparative example, and exemplary modifications will be described using the drawings. In the following description, however, the same constitutional elements are followed by the same signs, and the repeated explanation thereof will be occasionally omitted. It should be noted that in order to further clarify the explanation, the drawings are schematically shown in terms of the width, thickness, shape, and number of each unit in some cases as compared to an actual mode. However, each drawing is only an example, and does not limit the interpretation of the present invention.

[Embodiment]

Figure 1:
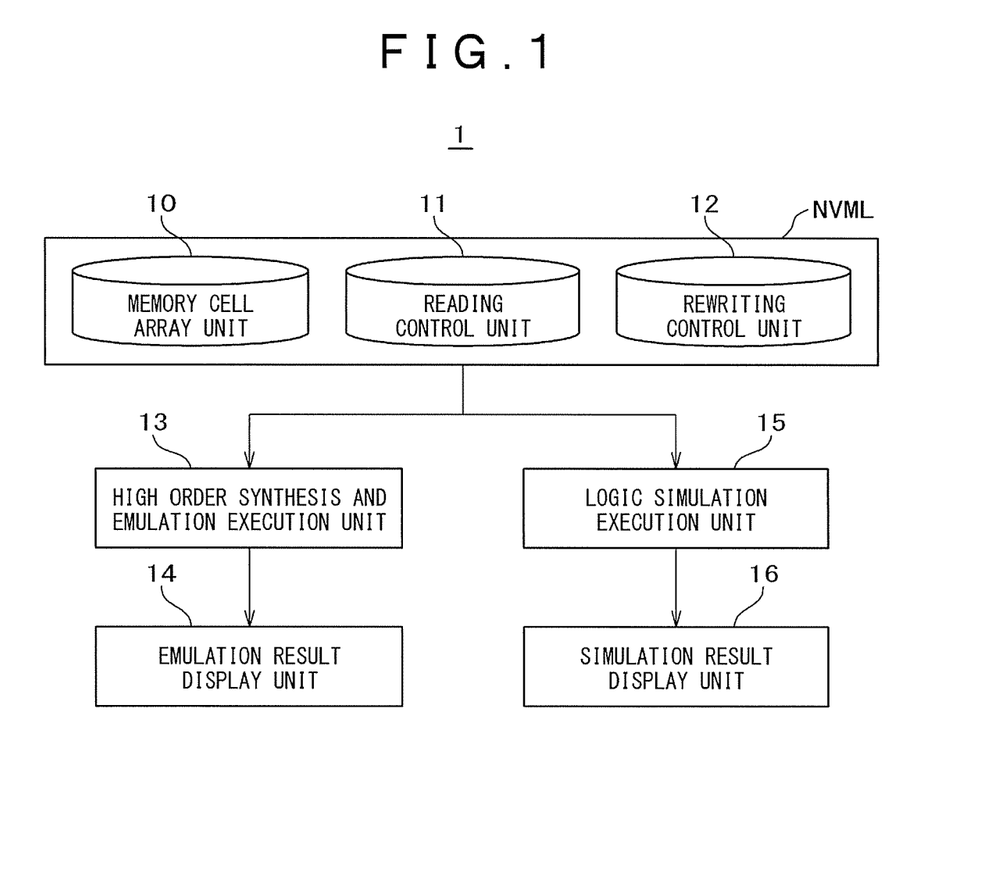
FIG. 1 is a diagram for showing a configuration example of a semiconductor circuit design device according to an embodiment of the invention.

FIG. 1 is a diagram for showing a configuration example of a semiconductor circuit design device according to an embodiment of the invention. A semiconductor circuit design device 1 includes a library unit NVML of a nonvolatile memory device NVM included in a semiconductor device to be designed. The nonvolatile memory device NVM is, for example, EEPROM (Electrically Erasable and Programmable Read-only Memory), a flash memory, or the like that is an example of an electrically writable and erasable nonvolatile memory. In the embodiment, a flash memory will be described as an example of the nonvolatile memory device NVM.

The library unit NVML is a library unit for high order synthesis and logic simulation, and stores the logic model of a flash memory NVM. The library unit NVML is configured using a memory cell array unit 10, a reading control unit 11, and a rewriting control unit 12. The memory cell array unit 10 has a description that defines the configuration of a memory array MARY of the flash memory NVM. The reading control unit 11 includes a description that defines an operation of reading data from the memory array MARY of the flash memory NVM. The rewriting control unit 12 includes a description that defines a data writing operation and a data erasing operation with respect to a writing area and an erasing area designated in the memory array MARY of the flash memory NVM. It should be noted that the writing operation is an operation (program operation) of, after erasing data of a memory cell to be written, writing data to the memory cell in the erased state. The erasing operation is an operation of erasing data of a memory cell to be erased. A rewriting operation is one of the above-described writing operation and erasing operation. In the application, the erasing operation is mainly described, but a problem, means for solving the problem, and an idea regarding effects are also the same in the writing operation.

The semiconductor circuit design device 1 further includes a high order synthesis and emulation execution unit 13, an emulation result display unit 14, a logic simulation execution unit 15, and a logic simulation result display unit 16. The high order synthesis and emulation execution unit 13 executes a high order synthesis process of the flash memory NVM using the logic model of the flash memory NVM defined by the library unit NVML and an emulation process for confirming the operation of the flash memory NVM using the synthesis result obtained by the high order synthesis process. The emulation result display unit 14 is provided for displaying and confirming the emulation result of the flash memory NVM. The logic simulation execution unit 15 executes a logic simulation for confirming the function of the flash memory NVM by using the logic model of the flash memory NVM defined by the library unit NVML. The logic simulation result display unit 16 is provided for displaying and confirming the logic simulation result of the flash memory. It should be noted that the high order synthesis process is a process of generating a description of a circuit of a register transfer level (RTL) from a logic model including an operation of a circuit to be designed and an algorithm.

The semiconductor circuit design device 1 can conduct the circuit design and function verification of the flash memory NVM in a short time by sharing the logic model of the flash memory NVM defined by the library unit NVML in the high order synthesis process and the logic simulation. Therefore, the circuit design and function verification of a semiconductor device such as a microcomputer incorporating the flash memory NVM can be similarly conducted in a short time.

Here, a flash memory to be designed and a microcomputer as an example of a semiconductor device incorporating the flash memory will be described. As a nonvolatile memory device for storing programs and data of a central processing unit (CPU) incorporated in a microcomputer, a flash memory is widely used. The flash memory is a memory cell whose stored content can be erased and written many times by setting the voltage applied at the time of rewriting higher than the voltage at the time of reading. The rewriting is performed in such a manner that a pulse-like voltage is applied to the memory cell, a current is allowed to flow in a gate insulating film, and electrons are injected or extracted to/from the memory cell.

Figure 8:
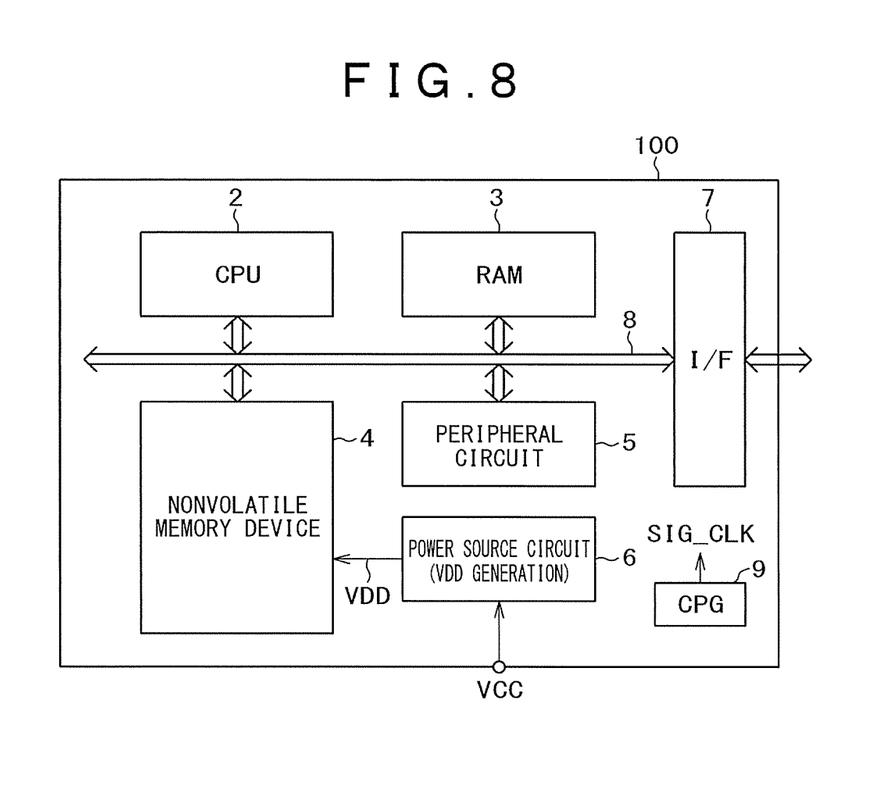
FIG. 8 is a block diagram for showing a configuration of a semiconductor device according to the embodiment.

FIG. 8 is a block diagram for showing a configuration of a semiconductor device. A microcomputer 100 that is an example of the semiconductor device includes, on one semiconductor chip, a CPU (Central Processing Unit) 2, a RAM (Random Access Memory) 3, a nonvolatile memory device 4, a peripheral circuit 5, a power source circuit 6, an interface circuit (I/F) 7, a data bus 8 coupling these to each other, and a clock generation circuit (CPG) 9.

The power source circuit 6 generates an internal power source voltage (VDD) on the basis of an external power source voltage (VCC) received from the outside of the microcomputer 100. The internal power source voltage (VDD) is supplied to each part of the microcomputer 100 (only supply to the nonvolatile memory device 4 is representatively shown in FIG. 8). The CPG 9 generates a clock signal SIG_CLK to be described later, and supplies the same to each of the internal circuits (2, 3, 4, 5, and 6) and the like.

The nonvolatile memory device 4 is a flash memory, and each memory cell of the flash memory has a charge accumulation unit between a gate electrode and a channel layer. The threshold voltage of the memory cell is changed depending on the charge accumulated in the charge accumulation unit, and information of data "1" or data "0" can be accordingly stored. As the charge accumulation unit, a floating gate formed of a polycrystalline silicon film, a silicon nitride film, or the like is used in general. The silicon nitride film accumulates charges according to trap levels dispersed in the film. In the embodiment, an example in which a silicon nitride film is used as the charge accumulation unit will be described. Next, a concrete configuration of the memory cell will be described in more detail.

Figure 9:
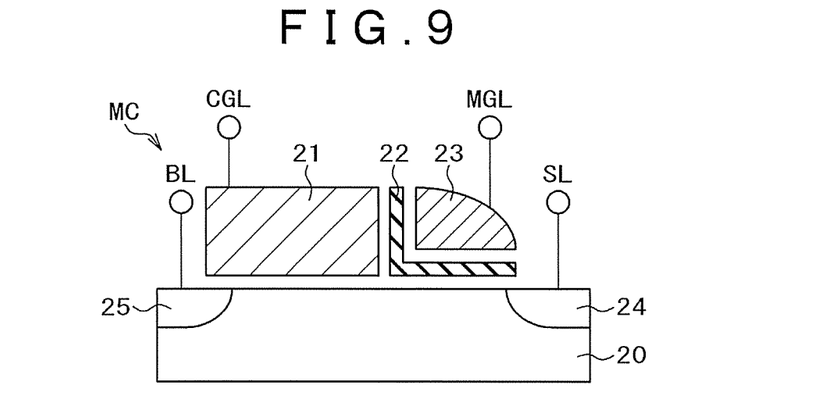
FIG. 9 is a cross-sectional view for schematically showing a configuration of a memory cell.
Figure 10:
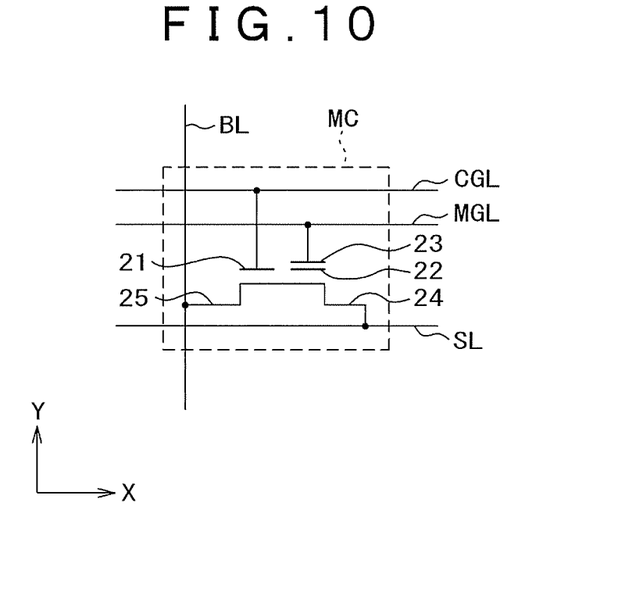
FIG. 10 is a diagram for showing a circuit diagram of the memory cell.

FIG. 9 is a cross-sectional view for schematically showing a configuration of a memory cell. FIG. 10 is a diagram for showing a circuit diagram of the memory cell. In FIGS. 9 and 10, the corresponding parts are followed by the same signs.

With reference to FIGS. 9 and 10, a memory cell MC is formed on a substrate 20, and includes a control gate (CG) 21, a charge accumulation unit 22, a memory gate (MG) 23, a source area 24, and a drain area 25. The control gate 21 is faulted on the surface of the P-type silicon substrate 20 via an insulating layer (not shown). The charge accumulation unit 22 is formed using an ONO (Oxide-Nitride-Oxide) film made of a silicon oxide film (not shown), a silicon nitride film (not shown), and a silicon oxide film (not shown) on a side wall of the control gate 21. The memory gate 23 having a side wall structure is formed on the ONO film. The source area 24 and the drain area 25 are formed by injecting N-type impurities into the substrate 20 on the left side of the control gate 21 and on the right side of the memory gate 23, respectively. When viewed from the direction perpendicular to the substrate 20, a part of the memory gate 23 overlaps with a part of the source area 24, and a part of the control gate 21 overlaps with a part of the drain area 25.

In the memory array MARY in which the memory cells MC are arranged, the respective memory cells extend in the row direction X corresponding to memory cell rows. A memory gate line MGL, a control gate line CGL, and a source line SL are provided. A main bit line BL extending in the column direction Y corresponding to memory cell columns is provided. In each memory cell MC, the memory gate 23 is coupled to the corresponding memory gate line MGL. The control gate 21 is coupled to the corresponding control gate line CGL. The source area 24 is coupled to the corresponding source line SL. The drain area 25 is coupled to the corresponding main bit line BL.

A unique address is allocated to each memory cell MC, and each memory cell MC stores one-bit data by a change in the threshold voltage according to the amount of charges of the charge accumulation unit 22.

Figure 11:
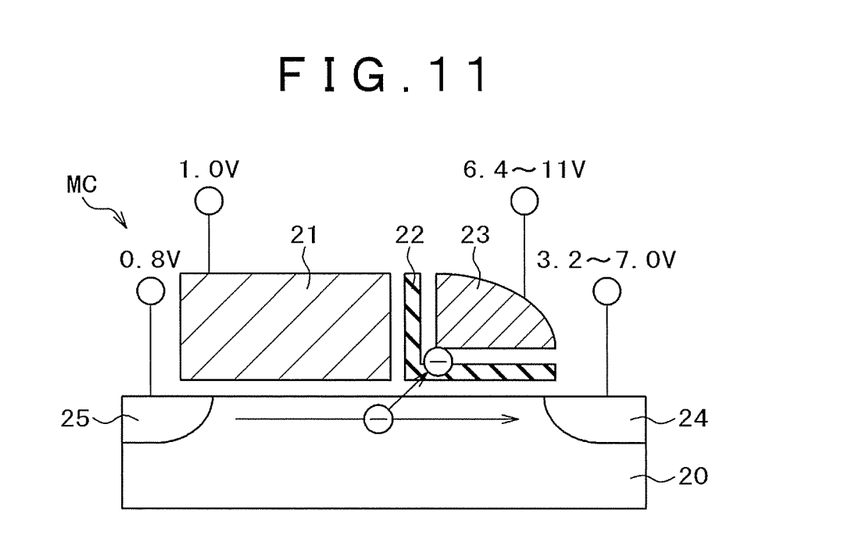
FIG. 11 is a diagram for showing a state of an operation of voltage application of a writing pulse.
Figure 12:
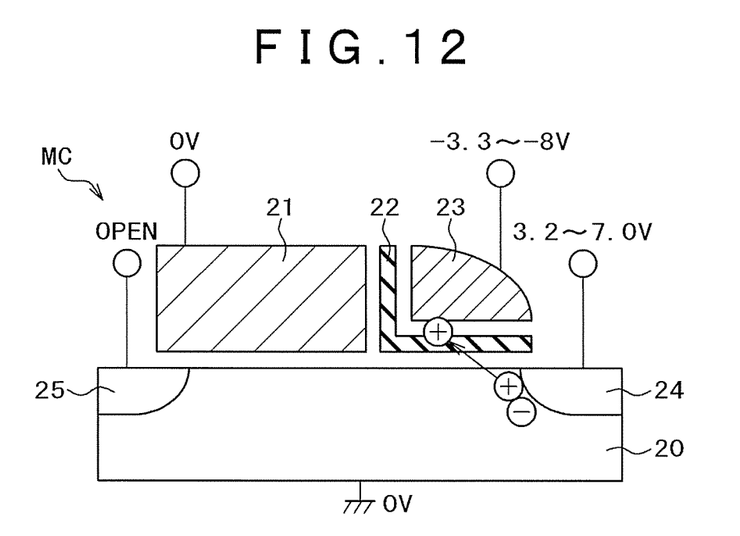
FIG. 12 is a diagram for showing a state of an operation of voltage application of an erasing pulse.

FIG. 11 and FIG. 12 show states when the memory cell MC is operated. FIG. 11 is a diagram for showing a state of a writing operation, namely, an operation of voltage application of a writing pulse, and FIG. 12 is a diagram for showing a state of an erasing operation, namely, an operation of voltage application of an erasing pulse. The explanation of a reading operation, a writing verification operation, and an erasing verification operation is omitted.

With reference to FIG. 11, in the writing pulse application operation, a voltage selected between 6.4 and 11 V is applied to the memory gate 23, a voltage of 1.0 V is applied to the control gate 21, a voltage selected between 3.2 and 7.0 V is applied to the source area 24, and a voltage of 0.8 V is applied to the drain area 25. Accordingly, hot electrons are injected into the charge accumulation unit 22 by a source side injection (SSI) method, and the threshold voltage of the memory cell MC is increased. The writing pulse application operation is repeated until the threshold voltage of the memory cell MC becomes higher than a predetermined writing verification voltage (PV). In the written memory cell MC, for example, "0" of data "0" and "1" is stored. Although "0" is stored in the application, it is obvious that "1" may be stored depending on a definition.

With reference to FIG. 12, in the erasing pulse application operation, a voltage selected between −3.3 and −8 V is applied to the memory gate 23, a voltage of 0 V is applied to the control gate 21, a voltage of 3.2 to 7.0 V is applied to the source area 24, the drain area 25 is set to an OPEN state, and the substrate 20 is grounded (a voltage of 0 V is applied). Accordingly, a high electric field is applied to a portion of the source area 24 overlapping with the memory gate 23. Therefore, since the energy band is bent, band to band tunneling (BTBT) in which electrons tunnel from the valence band to the conduction band occurs. Holes are generated in the valence band by the band to band tunneling. The tunneled electrons reach the source line SL, and some of the holes generated in the valence band reach the substrate 20. Thus, a current flows from the source line SL to the substrate 20. Some of the generated holes are accelerated by a high electric field to be hot holes, which are injected into the charge accumulation unit 22. As a result, the threshold voltage of the memory cell MC is decreased. The operation of voltage application of an erasing pulse by the band to band tunneling method is repeated until the threshold voltage of the memory cell MC becomes lower than a predetermined erasing verification voltage (EV). Therefore, a period of applying the voltage of the erasing pulse (a voltage applying period EPSP of the erasing pulse to be described later) is made relatively long. In the erased memory cell MC, "1" of data "0" and "1" is stored.

As described above, the writing or erasing is performed in the flash memory 4 in such a manner that a pulse-like voltage is applied to the memory cell, a current is allowed to flow in the gate insulating film, and electrons are injected or extracted to/from the charge accumulation unit. Therefore, the writing characteristics and erasing characteristics of the memory cell are largely affected by the device structure of the memory cell. Further, the flash memory 4 has a request for collective writing and erasing of large-volume data as compared to the RAM 3. Namely, in the logic model of the flash memory, it is necessary to consider the above-described writing characteristics and erasing characteristics of the memory cell and the request for collective writing and erasing of large-volume data.

Next, the rewriting control unit 12 of the library unit NVML will be described in more detail.

Figure 2:
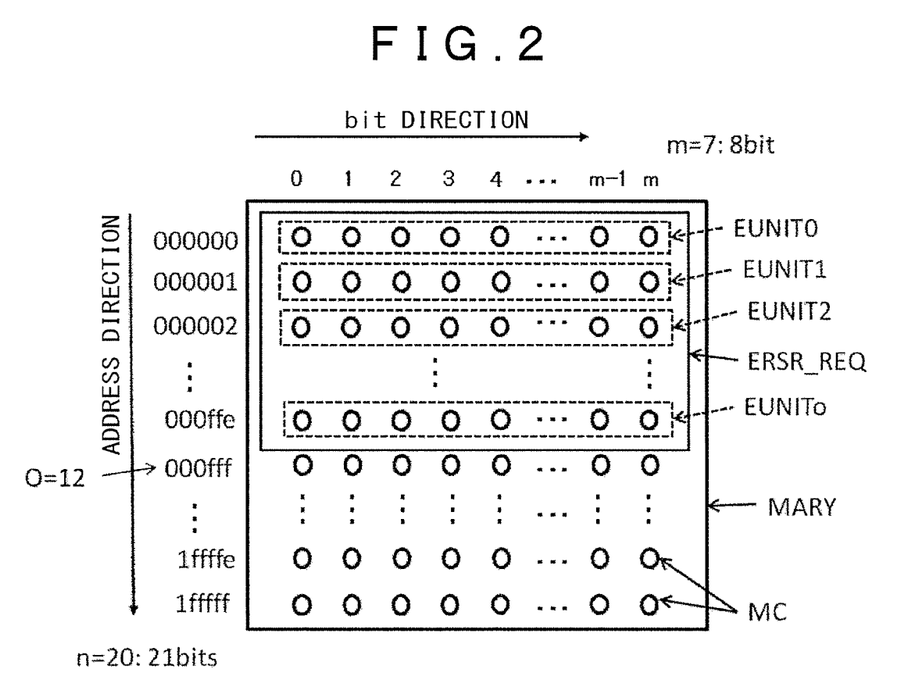
FIG. 2 is a diagram for explaining a configuration example of a memory array according to the embodiment.

FIG. 2 is a diagram for explaining a configuration example of a memory array according to the embodiment. An array declaration example of the memory cell array unit 10 is as follows when the verilog hardware description language (verilog HDL) language is used.

reg [m:0] mem_user [n:0];

Here, the variable m is a positive integer, and defines the number of memory cells MC in the bit direction. The variable n is a positive integer, and indicates the number of bits of an address. For example, in the case where m is 7 and n is 20, the memory array MARY having 2097152 addresses in which an 8-bit area is expressed by a 21-bit address is defined. In this case, the memory array MARY has a total memory capacity of 2M bytes. Namely, as shown in FIG. 2, the memory array MARY is defined as a memory array having eight memory cells MC of the bit direction arranged in a matrix in the address direction from the addresses 000000 (hexadecimal notation) to 1fffff (hexadecimal notation). In FIG. 2, it is assumed that the address represents a 21-bit address. Further, the memory cells MC are memory cells of the flash memory. Data "1" of the memory cell MC shows an erased state, and data "0" of the memory cell MC shows a written state. It should be noted that data "0" of the memory cell MC can be defined as an erased state, and data "1" of the memory cell MC can be defined as a written state by reversing the meaning of "0" and "1" as described above.

A description example of the rewriting control in the rewriting control unit 12 is described below as a description example 1 when the verilog HDL language is used.

DESCRIPTION EXAMPLE 1

```
always @ ( posedge SIG_CLK ) begin
  case (SIG_STATE)
    ST_ER EXE : begin
      if(add_ers_user[o-1:0] <= {o{1'b1}}) begin
        mem_user[{add_ers_user[n:o], {o{1'b0}}}+add_ers_user[o-1:0]] <= {(m+1){1'b1}};
        add_ers_user <= add_ers_user+1;
      end
    end
  endcase
end
```

The "(posedge SIG_CLK) begin" in the first line declares to operate at the rising edge (posedge: positive edge) of the clock signal SIG_CLK. It should be noted that the "(negedge SIG_CLK)" defines to operate at the falling edge (negedge: negative edge) of the clock signal SIG_CLK. The "(SIG_CLK)" defines to operate at both the rising edge and the falling edge of the clock signal SIG_CLK.

The "case (SIG_STATE)" in the second line declares conditional branch processing on the basis of the state of the signal state SIG_STATE.

The "ST_ER_EXE: begin" in the third line declares to be executed when the signal state SIG_STATE is set as the erasing execution state ST_ER_EXE (SIG_STATE= ST_ER_EXE is satisfied).

The "if (add_ers_user [o-1:0]<={o{1'b1}}) begin" in the fourth line defines to repeat the process 1 of the fifth row and the process 2 of the sixth row that follow when the "SIG_STATE=ST_ER_EXE" is satisfied and the erasing target address add_ers_user is within the erasing target area (in the case of a decimal number of 4095 or smaller). Here, the "{o{1'b1}}" is the definition of the requested erasing target area ERSR_REQ. When the variable o is 12, all the bits from the low-order 12th bit to the first bit are defined as "1" with respect to an arbitrary area represented by the 21st bit to the 13th bit in the 21-bit address. In the erasing target area ERSR_REQ, the minimum address is address 0, and the maximum address is 111111111110 in binary notation, ffe in hexadecimal notation, and 4095 in decimal notation.

The process 1 in the fifth line defines to set "1" that is an erased state to the corresponding address of the memory cell (mem_user). The setting is started from the lowest address (address 0) in the erasing target address add_ers_user [o-1:0] (4096 bytes). The "{(m+1){1'b1}}" indicates to set all the 8-bit memory cells to "1".

The process 2 in the sixth line defines to return to the fourth line by incrementing the erasing target address add_ers_user.

The "endcase" in the ninth line declares that the conditional branch processing declared in the second line has been completed.

Therefore, in the description example of the rewriting control using the verilog HDL language, the requested erasing target area ERSR_REQ in FIG. 2 is divided into a plurality of areas on an 8-bit (1 byte) basis, namely, a plurality of erasing unit areas EUNIT0 to EUNITo. Then, each of the divided erasing unit areas (EUNIT0 to EUNITo) is sequentially erased by time division at every rising edge of the clock signal SIG_CLK. In the logic model defined by the library unit NVML of the nonvolatile memory device, the erasing processing unit is 8 bits (1 byte), and one erasing processing unit is allocated to one address.

Figure 3:
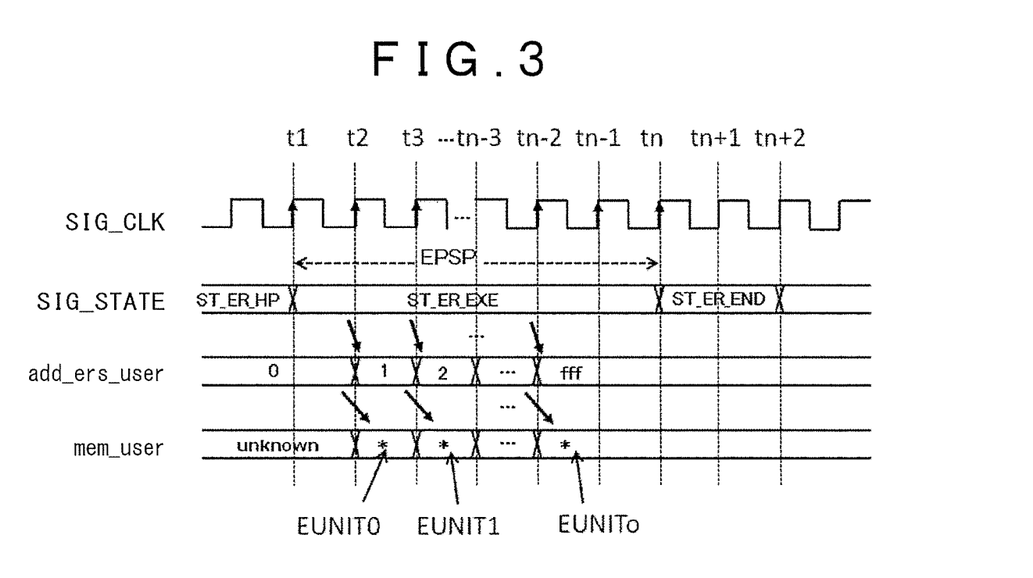
FIG. 3 is a timing chart for explaining rewriting control according to the embodiment.

FIG. 3 is a timing chart for explaining the rewriting control according to the embodiment. It should be noted that the variables m, n, and o used are 7, 20, and 12, respectively. In the initial state, the signal state SIG_STATE is set to the erasing initial state ST_ER_HP, and the erasing target address add_ers_user is set to 0 (zero). Further, the data of the memory cell MC is unknown, namely, "0" or "1". In FIG. 3, the period from the first time t1 to the n-th time to is the definition of the voltage applying period EPSP of the erasing pulse of the flash memory to be designed, and is a period necessary to set all the memory cells in the erasing target area ERSR_REQ to the erased state in this period.

At the first time t1, the clock signal SIG_CLK rises and the signal state SIG_STATE transitions from the initial state ST_ER_HP to the erasing execution state ST_ER_EXE. At this time, the erasing target address add_ers_user is the 0 (zero) address, which is within the erasing target area ERSR_REQ.

By the rise of the clock signal SIG_CLK at the second time t2, the erasing target address add_ers_user is incremented by 1 to be the first address. Further, all the memory cells MC of 8 bits (1 byte) corresponding to the 0 address of the erasing target address add_ers_user are set to "1", and the erasing process of the erasing unit area EUNIT0 is executed. It should be noted that the process is indicated as "*" in FIG. 3, and "*" indicates that all the cells of the target memory cells MC have been set to the erased state "1".

By the rise of the clock signal SIG_CLK at the third time t3, the erasing target address add_ers_user is incremented by 1 to be the second address. Further, all the memory cells MC of 8 bits (1 byte) corresponding to the first address of the erasing target address add_ers_user are set to "1", and the erasing process of the erasing unit area EUNIT1 is executed.

The erasing process similar to the above is sequentially executed, and the erasing target address add_ers_user is incremented by 1 to be the fff address (in hexadecimal notation) by the rise of the clock signal SIG_CLK at the (n−2)-th time tn−2. Further, all the memory cells of 8 bits (1 byte) corresponding to the ffe address (hexadecimal notation) of the erasing target address add_ers_user are set to "1", and the erasing process of the erasing unit area EUNITo is executed. Accordingly, all the memory cells MC in the erasing target area ERSR_REQ are set to the erased state between the first time t1 and the n-th time to that is the voltage applying period EPSP of the erasing pulse. Then, the signal state SIG_STATE is set to the erasing end state ST_ER_END by the rising edge of the clock signal SIG_CLK at the (n+1)-th time tn+1, and the erasing operation of the erasing target area ERSR_REQ is completed.

In the case where the device structure of the flash memory is considered, a period of time (the period of ST_ER_EXE) necessary for rewriting the data of the memory cell MC is several ms (milliseconds) at the time of erasing and several μs (microseconds) at the time of writing. According to the embodiment, it is possible to shorten the time of the high order synthesis by rewriting the memory cell in units of erasing (1 byte) in a time division manner using the period of time (the period of ST_ER_EXE).

COMPARATIVE EXAMPLE

Figure 4:
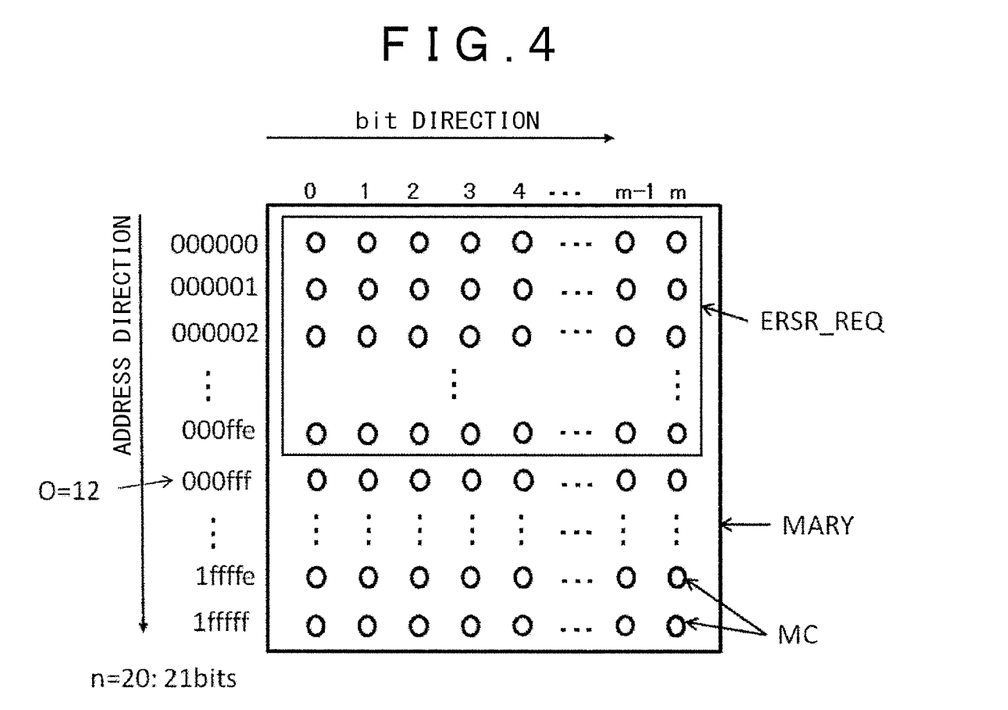
FIG. 4 is a diagram for explaining a configuration example of a memory array according to a comparative example.

FIG. 4 is a diagram for explaining a configuration example of a memory array according to a comparative example. FIG. 4 shows a matter examined by the inventors in consideration of the idea of the rewriting control description described in lines 1106 to 1125 of "Microchip Technology Inc., serial EEPROM Verilog model, 11xx010 Verilog Model.zip, M11AA010.v, Internet <URL:http://www.microchip.com/ja/design-centers/memory/serial-eeprom/ve rilog-ibis-models>, the retrieval date: Nov. 25, 2016", but is not publicly known. As similar to FIG. 2, the array declaration example of the memory cell array unit 1 is as follows when the verilog HDL language is used.

reg [m:0] mem_user [n:0];

Here, the variables m and n are the same as those in FIG. 2, and m is 7 and n is 20. Therefore, the configuration of the memory array is also the same as that in FIG. 2, and the memory array MARY having 2097152 addresses in which an 8-bit area is expressed by a 21-bit address is defined.

A description example of the rewriting control in the rewriting control unit 12 is described below as a description example 2 when the verilog HDL language is used.

DESCRIPTION EXAMPLE 2

```
always @ ( posedge SIG_CLK ) begin
   case (SIG_STATE)
      ST_ER_END : begin
         for (i=0; i<={o{1'b1}}; i=i+1) mem_user[{add_ers_user[n:o],
{o{1'b0}}}+i]
={(m+1){1'b1}};
         end
      endcase
end
```

The first line and the second line are the same as those in the above-described description example 1.

The "ST_ER_END: begin" in the third line declares to be executed when the signal state SIG_STATE is set to the erasing end state ST_ER_END (SIG_STATE=ST_ER_END is satisfied).

The "for" section in the fourth line defines to set all the memory cells included in all the addresses of the erasing target area ERSR_REQ are set to the erased state. The "{o{1'b1}}" is the definition of the requested erasing target area ERSR_REQ. When the variable o is 12, the address range is the same as described above.

Figure 5:
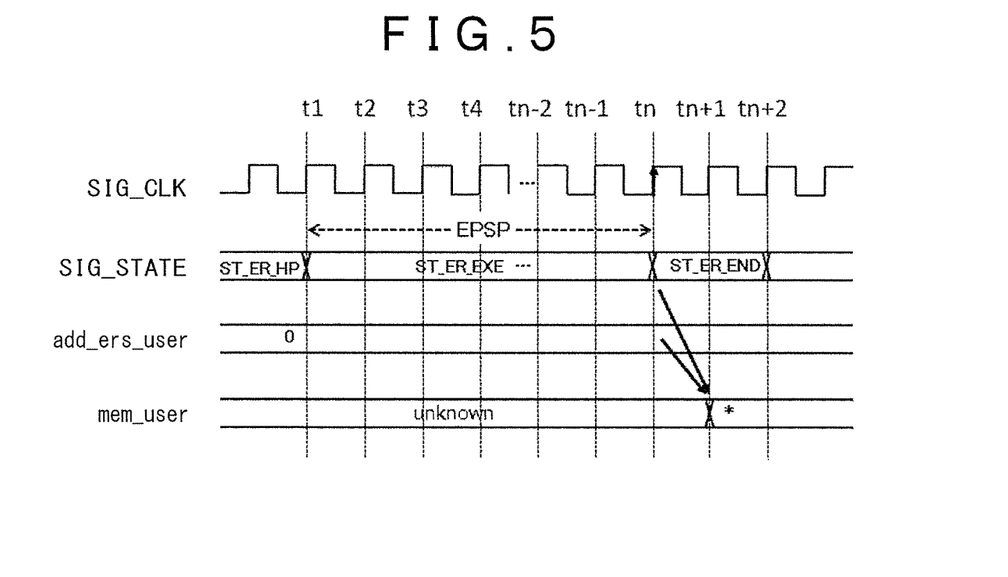
FIG. 5 is a timing chart for explaining rewriting control according to the comparative example.

FIG. 5 is a timing chart for explaining the rewriting control according to the comparative example. It should be noted that the variables m, n, and o used are 7, 20, and 12, respectively. As shown in FIG. 5, since the signal state SIG_STATE is set to the erasing end state ST_ER_END at the rising edge of the clock signal SIG_CLK at the n-th time tn, the writing to the erased state of all the memory cells to be erased is started at the rising edge of the clock signal SIG_CLK at the (n+1)-th time tn+1. Namely, after the elapse of the first time t1 to the n-th time tn that is the voltage applying period EPSP of the erasing pulse, the writing to the erased state of all the memory cells to be erased is simultaneously started.

According to the examination by the inventors, the inventors found that when the logic model of the flash memory of the comparative example was implemented by a commercially-available high order synthesis/hardware emulator, the number of ports (terminals) for the flash memory was increased by the number corresponding to that of erasing target addresses (4096 ports) at the time of high order synthesis. Therefore, the inventors discovered a problem that since the load of high order synthesis is increased, the high order synthesis process is not completed and is required for a long time.

<First Exemplary Modification>

A first exemplary modification of the description example of the rewriting control in the rewriting control unit 12 will be described below. The description example of the rewriting control according to the first exemplary modification is shown below as a description example 3 when the verilog HDL language is used. It should be noted that the variables m, n, and o are 7, 20, and 13, respectively in this case. Namely, the erasing target area has 8192 bytes that is twice the area of the example.

DESCRIPTION EXAMPLE 3

```
always @ ( SIG_CLK ) begin
   case (SIG_STATE)
      ST_ER_EXE : begin
         if(add_ers_user[o-1:0] <= {o{1'b1}}) begin
            mem_user[{add_ers_user[n:o], {o{1'b0}}}+add_ers_user[o-1:0]] <=
{(m+1) {1'b1}};
            add_ers_user < = add_ers_user+1;
         end
      end
   endcase
end
```

The "(SIG_CLK) begin" in the first line is different from the description example 1 described in the embodiment. The first line of the first modified example defines to execute the erasing operation at both the rising edge and the falling edge of the clock signal SIG_CLK.

Figure 6:
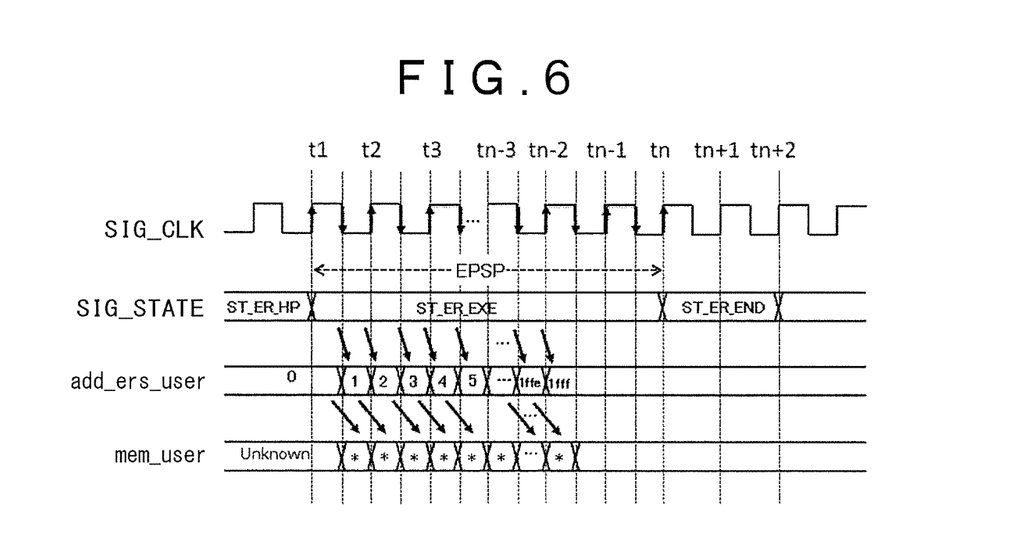
FIG. 6 is a timing chart for explaining rewriting control according to a first exemplary modification.

FIG. 6 is a timing chart for explaining the rewriting control according to the first exemplary modification. As shown in FIG. 6, every time the rising edge and the falling edge of the clock signal SIG_CLK occur, all the memory cells in the 1-byte erasing unit are set to the erased state.

The clock signal SIG_CLK corresponds to a clock signal supplied from the clock generation circuit (CPG) 9 outside the flash memory, and the cycle thereof is constant. The period of the "SIG_STATE=ST_ER_EXE" is the voltage applying period EPSP of the erasing pulse to the memory cell to be erased, and is a predetermined period of time determined by the erasing characteristics of the flash memory to be designed. Therefore, in the embodiment, there is a problem that only the memory cells corresponding to the number of addresses obtained by dividing the period of the "SIG_STATE=ST_ER_EXE" by the cycle of the clock signal SIG_CLK can be set to the erasing state.

According to the first exemplary modification, both the rising edge and the falling edge of the clock signal SIG_CLK are used to solve this problem. Accordingly, the addresses the number of which is twice as many as that in the case of using only the rising edge of the embodiment can be set to the erased state in the voltage applying period EPSP of the erasing pulse. Due to the advance of the semiconductor miniaturization technique and the multifunction of semiconductor products, the processing capability (an increase in capacity of the writing area or the erasing area) required for the flash memory is increasing year by year. The first exemplary modification can deal with the request.

<Second Exemplary Modification>

A second exemplary modification is an example in which the description of the rewriting control in the rewriting control unit 12 is changed, and will be described in detail below. The description example of the rewriting control according to the second exemplary modification is shown below as a description example 4 when the verilog HDL language is used. It should be noted that the variables m, n, and o are 7, 20, and 13, respectively in this case. Namely, the erasing target area has 8192 bytes that is twice the area of the embodiment.

DESCRIPTION EXAMPLE 4

```
always @ ( posedge int_sig_clk ) begin
  case (SIG_STATE)
    ST_ER_EXE : begin
      if(add_ers_user[o-1:0] <= {o{1'b1}}) begin
        mem_user+[{add_ers_user[n:o], {o{1'b0}}}+add_ers_user[o-1:0]] <= {(m+1){1'b1}};
        add_ers_user <= add_ers_user+1;
      end
    end
  endcase
end
```

The "(Posedge int_sig_clk) begin" in the first line is different from the description example described in each of the description example 1 of the embodiment and the description example 3 of the first exemplary modification. The first line of the second exemplary modification defines the clock signal int_sig_clk that is internally generated and to execute the erasing operation at the rising edge. The internal clock signal int_sig_clk is defined as a frequency twice the clock signal SIG_CLK.

Figure 7:
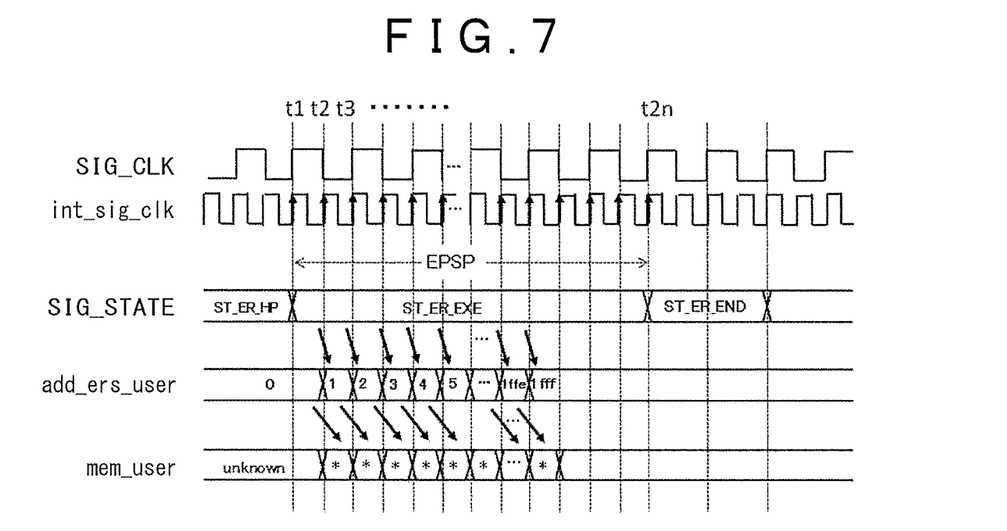
FIG. 7 is a timing chart for explaining rewriting control according to a second exemplary modification.

FIG. 7 is a timing chart for explaining the rewriting control according to the second exemplary modification. As shown in FIG. 7, the frequency of the internal clock signal int_sig_clk is twice the frequency of the clock signal SIG_CLK. All the memory cells in the 1-byte erasing unit area are set to the erased state on a one erasing unit area basis at every rising edge of the internal clock signal int_sig_clk.

Although the clock signal SIG_CLK supplied from the clock generation circuit (CPG) 9 outside the flash memory is used in each of the embodiment and the first exemplary modification, the number of addresses that can be set to the erased state is limited because the cycle of the clock signal SIG_CLK is constant. Thus, in the second exemplary modification, the virtual internal clock signal int_sig_clk is generated within the logic model of the flash memory, and the cycle thereof is made shorter than that of the clock signal SIG_CLK. Accordingly, the number of addresses that can be set to the erased state can be increased in the voltage applying period EPSP of the erasing pulse. FIG. 7 shows a case in which the cycle of the internal clock signal int_sig_clk is set to ½ of that of the clock signal SIG_CLK and only the rising edge thereof is used.

According to the second exemplary modification, the erasing target area in the address range twice as large as that in the embodiment can be set to the erased state in the voltage applying period EPSP of the erasing pulse as similar to the first exemplary modification. Due to the advance of the semiconductor miniaturization technique and the multi-function of semiconductor products, the processing capability (an increase in capacity of the writing area or the erasing area) required for the flash memory is increasing year by year. The second exemplary modification can deal with the request.

As another exemplary modification, if the frequency of the internal clock signal int_sig_clk is further increased to, for example, three times and both the rising edge and the falling edge are used as in the first exemplary modification, the number of addresses that can be set to the erased state can be further increased in the voltage applying period EPSP of the erasing pulse.

The invention achieved by the inventors has been concretely described above on the basis of the embodiment and the exemplary modifications. However, it is obvious that the present invention is not limited to the above-described the embodiment and the exemplary modifications, and can be variously changed.

For example, the number of memory cells to be erased at a time is increased by increasing from m=7 to m=15, and it is possible to realize the logic model of the flash memory that matches the configuration of a large-capacity memory cell array of a flash memory mounted on a semiconductor product to be designed.

What is claimed is:

1. A semiconductor circuit design device comprising:
   a library unit having a logic model of a nonvolatile memory device to be designed;
   a high order synthesis and emulation execution unit that executes a high order synthesis process using the logic model and an emulation process for confirming an operation of the nonvolatile memory device using the synthesis result obtained by the high order synthesis process; and
   a logic simulation execution unit that executes a logic simulation for confirming the function of the nonvolatile memory device using the logic model,
   wherein the library unit includes a memory cell array unit that defines a memory array, and a rewriting control unit that defines a writing operation or an erasing operation of data for a writing area or an erasing area designated in the memory array,
   wherein the rewriting control unit includes a definition of dividing the designated writing area or erasing area into a plurality of areas and of sequentially erasing each of the divided areas in a time division manner,
   wherein the library unit defines a clock signal and an internal clock signal whose frequency is higher than that of the clock signal, and
   wherein each of the divided areas is erased according to a rising edge of the internal clock signal or the rising edge and a falling edge of the internal clock signal.

2. The semiconductor circuit design device according to claim 1, wherein each of the divided areas is erased according to a rising edge of a clock signal.

3. The semiconductor circuit design device according to claim 1, wherein each of the divided areas is erased according to the rising edge and a falling edge of the clock signal.

4. A method for operating a semiconductor circuit design device comprising:
   preparing a library having a logic model of a nonvolatile memory device to be designed;
   obtaining a synthesis result by executing a high order synthesis using the logic mode;
   confirming an operation of the nonvolatile memory device by executing an emulation process; and
   confirming the function of the nonvolatile memory device by executing a logic simulation using the logic model,
   wherein the library includes a memory cell array model that defines a memory array, and a rewriting controller model that defines a writing operation or an erasing operation of data for a writing area or an erasing area designated in the memory array, wherein the rewriting controller model includes a definition of dividing the designated writing area or erasing area into a plurality of areas and of sequentially erasing each of the divided areas in a time division manner, wherein the library defines a clock signal and an internal clock signal whose frequency is higher than that of the clock signal, and wherein each of the divided areas is erased according to a rising edge of the internal clock signal or the rising edge and a falling edge of the internal clock signal.

5. The method according to claim 4, wherein each of the divided areas is erased according to a rising edge of a clock signal.

6. The method according to claim 4, wherein each of the divided areas is erased according to the rising edge and a falling edge of the clock signal.

* * * * *